US011823910B2

(12) United States Patent
O'Meara et al.

(10) Patent No.: US 11,823,910 B2
(45) Date of Patent: Nov. 21, 2023

(54) SYSTEMS AND METHODS FOR IMPROVING PLANARITY USING SELECTIVE ATOMIC LAYER ETCHING (ALE)

(71) Applicant: Tokyo Electron Limited, Tokyo (JP)

(72) Inventors: David O'Meara, Albany, NY (US); Anthony Dip, Austin, TX (US); Masanobu Igeta, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 71 days.

(21) Appl. No.: 16/944,563

(22) Filed: Jul. 31, 2020

(65) Prior Publication Data

US 2022/0037162 A1    Feb. 3, 2022

(51) Int. Cl.
*H01L 21/3105* (2006.01)
*C23C 16/458* (2006.01)
*C23C 16/455* (2006.01)

(52) U.S. Cl.
CPC .... *H01L 21/31055* (2013.01); *C23C 16/4584* (2013.01); *C23C 16/45553* (2013.01)

(58) Field of Classification Search
CPC .................. H01L 21/31055; H01L 21/31056
See application file for complete search history.

(56) References Cited

U.S. PATENT DOCUMENTS

| | | | | |
|---|---|---|---|---|
| 4,680,084 A * | 7/1987 | Heimann | ........... | G01B 11/0683 216/48 |
| 5,975,912 A * | 11/1999 | Hillman | ..................... | C23C 8/02 438/597 |
| 7,314,835 B2 * | 1/2008 | Ishizaka | ............ | H01L 21/76843 438/758 |
| 2009/0197404 A1 * | 8/2009 | Yang | ................. | H01L 21/76808 257/E21.585 |
| 2018/0308695 A1 * | 10/2018 | LaVoie | ............. | H01L 21/31116 |
| 2021/0217584 A1 * | 7/2021 | Kuyel | ............... | H01J 37/32724 |

OTHER PUBLICATIONS

Fang, Chang, et al. "Thermal Atomic Layer Etching: Mechanism, Materials and Prospects." Progress in Natural Science: Materials International, vol. 28, No. 6, Dec. 2018, doi:https://doi.org/10.1016/j.pnsc.2018.11.003.

* cited by examiner

*Primary Examiner* — Thomas T Pham

(57) ABSTRACT

Methods are provided for planarizing a patterned substrate in a spatial atomic layer processing system comprising a rotating platen. The patterned substrate may generally include features having higher regions and lower regions. To planarize the patterned substrate, or reduce a height differential between the higher and lower regions, a selective atomic layer etching (ALE) process is disclosed to preferentially form a modified layer on the higher regions of the features by exposing a surface of the patterned substrate to a precursor gas while the rotating platen spins at a high rotational speed. By preferentially forming the modified layer on the higher regions of the features, and subsequently removing the modified layer, the selective ALE process described herein preferentially etches the higher regions of the features to lessen the height differential between the higher and lower regions until a desired planarization of the features is achieved.

18 Claims, 8 Drawing Sheets

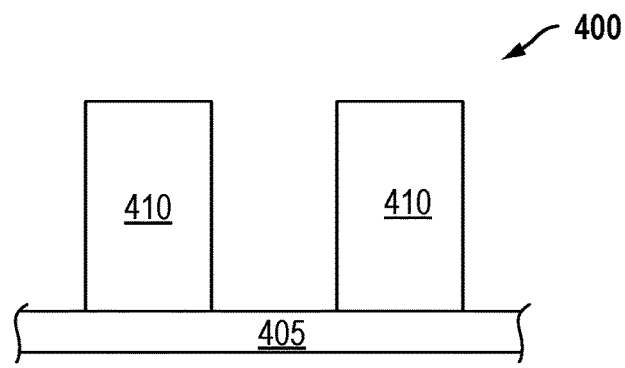
FIG. 5A
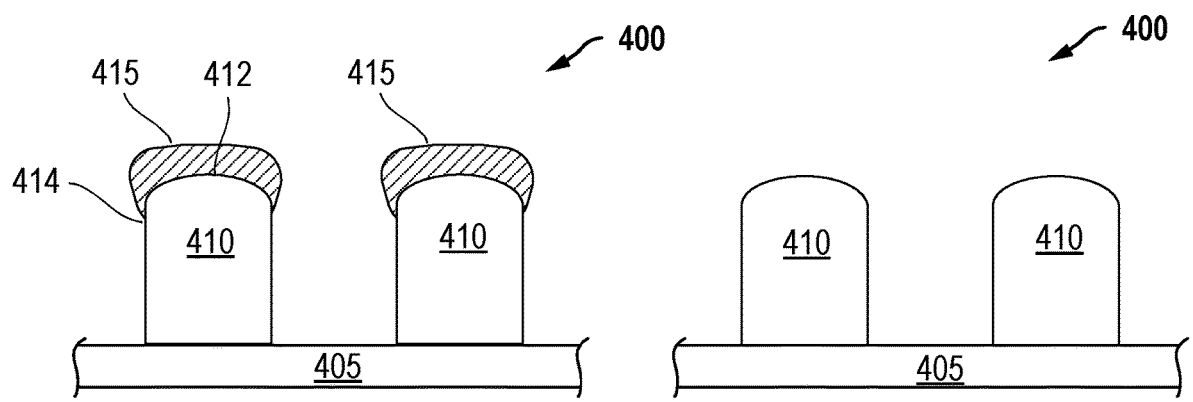
FIG. 5B
FIG. 5C
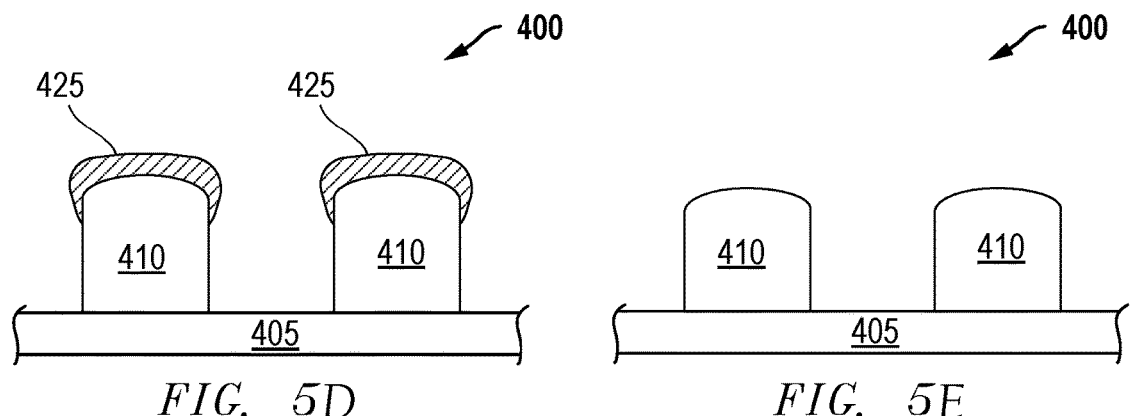
FIG. 5D
FIG. 5E

SYSTEMS AND METHODS FOR IMPROVING PLANARITY USING SELECTIVE ATOMIC LAYER ETCHING (ALE)

BACKGROUND

The present disclosure relates to the planarization of substrates. In particular, it provides embodiments of a system and a method for planarizing a surface of a substrate.

Atomic layer processes, such as atomic layer deposition (ALD) and atomic layer etching (ALE), have become important in the industry, offering techniques capable of accurately controlling material properties and nanometer dimensions. Atomic layer deposition (ALD) is a known technique for forming thin layers on a substrate. In ALD, substrates are cyclically exposed to alternate gaseous species (or precursors), which react with the substrate surface in a self-limiting, or near self-limiting manner, to slowly build up a thin film or layer on a substrate. Multiple ALD cycles are generally performed to deposit or form a desired film thickness by repeating the cycles of alternating gaseous species.

Atomic layer etching (ALE) is a known technique for removing or etching thin layers sequentially (often one monolayer at a time) through one or more self-limiting reactions or near self-limiting reactions. ALE processes often include multiple ALE cycles of layer modification and etch steps, wherein the layer modification step modifies exposed surfaces of a substrate and the etch step selectively removes the modified layer. During the layer modification step, a surface of the substrate may be exposed to a reactive precursor, which adsorbs on and reacts with the surface material to produce a modified surface layer. This layer modification step may be self-limiting, for example, if the reaction stops after adsorbing one monolayer. During the etch step, the surface of the substrate may be bombarded with ions to remove or etch the modified surface layer. Other etch removal mechanisms may alternatively be used. The etch step may also be self-limiting if the energy or chemistry of the etch step is sufficient to remove the modified surface layer, but insufficient to etch the underlying material. Multiple ALE cycles are generally performed to remove or etch a desired film thickness.

ALD and ALE processes can be performed within a variety of atomic layer processing systems or tools. For example, batch furnace type systems may be utilized to perform ALD or ALE processes. Single substrate systems, in which a process chamber is filled with gas and evacuated for a single substrate, may also be utilized. Yet another system is a spatial atomic layer processing system. In spatial atomic layer processing systems, substrates travel at relatively high speeds past a plurality of gas sources (e.g., gas injectors, a gas showerhead, or a gas showerhead with injector outlets), which inject the necessary gases proximate to the substrate surface to accomplish ALD or ALE process steps as the substrate rotates in a cyclical manner.

The ability to planarize is important to the fabrication of integrated circuits (ICs) and can be used at several levels during the IC fabrication process to prevent defects, avoid shorting paths and to perform selective patterning techniques. Chemical mechanical polishing (CMP) is an example of a planarization technique commonly used in IC fabrication.

SUMMARY

Systems and methods are provided herein for planarizing a patterned substrate in a spatial atomic layer processing system. The patterned substrate may include, for example, one or more features having higher regions and lower regions, such that a height differential exists between the higher and lower regions. In order to planarize the patterned substrate, or reduce the height differential between the higher and lower regions, the patterned substrate may be subject to a selective atomic layer etching (ALE) process, which preferentially forms a modified layer on the higher regions of the one or more features, as compared to the lower regions of the one or more features. By preferentially forming the modified layer on the higher regions of the one or more features, and subsequently removing the modified layer, the selective ALE process described herein preferentially etches the higher regions of the one or more features to lessen the height differential between the higher and lower regions of the one or more features.

In an embodiment of the selective ALE process described herein, a patterned substrate comprising one or more features is provided on a rotating platen of a spatial atomic layer processing system, and a modified layer is preferentially formed on higher regions of the one or more features by exposing a surface of the patterned substrate to a first precursor gas while the rotating platen spins. In one embodiment, as the rotation speed increases for a given set of process variables (for example chemistry and temperature), the preferential formation on higher regions increases. Spinning the rotating platen at higher rotational speeds causes the modified layer to be more preferentially formed on the one or more features, such that a thickness of the modified layer is greater on the higher regions, than on the lower regions of the one or more features. When the modified layer is subsequently removed (in one example, but not limited to, a subsequent plasma removal step), the higher regions are preferentially etched to lessen the height differential between the higher and lower regions of the one or more features.

By repeating the steps of forming the modified layer and removing the modified layer, the selective ALE process described herein may be used to gradually reduce a height of the one or more features until a desired planarization of the one or more features is achieved. Thus, a planarization technique is provided in which a spatial atomic processing system is utilized to provide an ALE process which planarizes the substrate. In one embodiment, height differentials are decreased by 25%. In another embodiment, height differentials are decreased by 50% or more. In this manner, planarization may occur. In some embodiments, the rotating platen is rotated at speeds of 30 RPM or more to achieve the planarization described herein. In other embodiments, the RPM is 100 RPM or more. For example, RPMs of 200 RPM or more may be utilized. In other embodiments, the rotating platen may be rotated at speeds up to 6,000 RPM.

According to one embodiment, a method is provided herein for planarizing a patterned substrate in a spatial atomic layer processing system. The method may generally begin by providing at least a first layer as part of the patterned substrate. In some embodiments, the first layer may comprise at least a portion of one or more features formed on the patterned substrate. In some embodiments, the one or more features may have higher regions and lower regions, such that a height differential exists between the higher regions and the lower regions. The first layer provided on the patterned substrate may comprise a variety of materials. In one embodiment, the first layer may be an oxide.

Next, the method may include providing the patterned substrate on a rotating platen of the spatial atomic layer processing system, and forming a modified layer on the first layer. At least one step of forming the modified layer on the first layer may include exposing a surface of the first layer to a first precursor gas, which adsorbs on and reacts with the surface of the first layer to produce the modified layer. The surface of the first layer may be exposed to a variety of first precursor gases when forming the modified layer. In one embodiment, the first precursor gas may comprise trimethylaluminum, $BCl_3$, HF, $Cl_2$, $CF_4/O_2$, and/or $F_2/He$.

When forming the modified layer, spinning the rotating platen at higher rotational speeds aids in the modified layer being preferentially formed onto the higher regions of the one or more features, as compared to the lower regions of the one or more features. As used herein, "preferentially formed" means that a thickness of the modified layer may be greater on the higher regions of the one or more features than on the lower regions of the one or more features. In some embodiments, the rotational speed of the rotating platen may cause enhanced deposition of a first precursor of the first precursor gas on the higher regions of the one or more features as compared to the lower regions of the one or more features. In some embodiments, the rotational speed may be selected from a range between 30 RPM and 240 RPM. In some embodiments, the rotational speed may be adjusted during one or more of the steps of forming the modified layer and removing the modified layer.

After the modified layer is formed, the method may remove the modified layer. In some embodiments, the modified layer may be removed via a plasma removal step. By forming the modified layer on the first layer and subsequently removing the modified layer, the method may preferentially etch the higher regions of the one or more features, as compared to the lower regions of the one or more features, so as to lessen the height differential between the higher regions of the one or more features and the lower regions of the one or more features. In some embodiments, the method may repeat the steps of forming the modified layer and removing the modified layer so as to further reduce the height differential and planarize the patterned structure. In some embodiments, the height differential between the higher regions and the lower regions may be reduced by at least 50% by utilizing the method disclosed herein.

According to another embodiment, another method provided herein for planarizing a patterned substrate in a spatial atomic layer processing system. In this embodiment, the method may generally begin by providing the patterned substrate on a rotating platen of the spatial atomic layer processing system. As noted above, one or more features formed on the patterned substrate may have higher regions and lower regions.

Next, the method may include spinning the rotating platen and exposing a surface of the patterned substrate to a precursor gas to form a modified layer on the patterned substrate. In some embodiments, the surface of the patterned substrate may comprise an oxide and the precursor gas may comprise trimethylaluminum, $BCl_3$, HF, $Cl_2$, $CF_4/O_2$, and/or $F_2/He$.

As noted above, the rotational speed of the rotating platen may cause the modified layer to be preferentially formed on the higher regions of the one or more features. In some embodiments, the rotational speed of the rotating platen may be selected from a range between 30 RPM and 240 RPM. In other embodiments, the rotational speed of the rotating platen may be selected from a range between 100 RPM and 6,000 RPM. In one example embodiment, the rotational speed of the rotating platen may be above 200 RPM.

After the modified layer is formed on the patterned substrate, the method may include removing the modified layer so that the higher regions of the one or more features are preferentially etched as compared to the lower regions of the one or more features. In some embodiments, the modified layer may be removed via a plasma removal step. In some embodiments, the rotational speed of the rotating platen may be adjusted during one or more of the steps of exposing a surface of the patterned substrate to a precursor gas to form a modified layer and removing the modified layer.

In some embodiments, the method may repeat the steps of exposing a surface of the patterned substrate to a precursor gas to form a modified layer and removing the modified layer to gradually reduce a height of the one or more features until a desired planarization of the one or more features is achieved. In some embodiments, the desired planarization may reduce the height differential between the higher regions and the lower regions by at least 25%. In other embodiments, the desired planarization may reduce the height differential between the higher regions and the lower regions by at least 50%.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 5A-5E illustrate one embodiment of a process flow for planarizing a patterned substrate using the techniques described herein.

DETAILED DESCRIPTION

Figure 1:
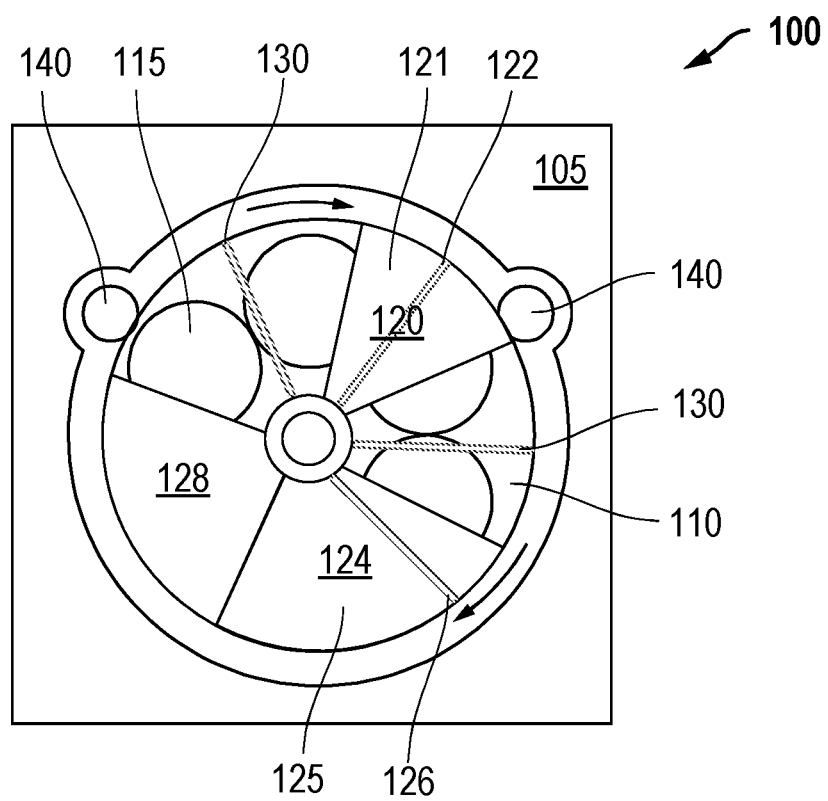
FIG. 1 is a block diagram illustrating one embodiment of a spatial atomic layer processing system that may be used to perform the techniques described herein.

Systems and methods are provided herein for planarizing a patterned substrate in a spatial atomic layer processing system. The patterned substrate may include, for example, one or more features having higher regions and lower regions, such that a height differential exists between the higher and lower regions. In order to planarize the patterned substrate, or reduce the height differential between the higher and lower regions, the patterned substrate may be subject to a selective atomic layer etching (ALE) process, which preferentially forms a modified layer on the higher regions of the one or more features, as compared to the lower regions of the one or more features. By preferentially forming the modified layer on the higher regions of the one or more features, and subsequently removing the modified layer, the selective ALE process described herein preferentially etches the higher regions of the one or more features to lessen the height differential between the higher and lower regions of the one or more features.

In an embodiment of the selective ALE process described herein, a patterned substrate comprising one or more features is provided on a rotating platen of a spatial atomic layer processing system, and a modified layer is preferentially formed on higher regions of the one or more features by exposing a surface of the patterned substrate to a first precursor gas while the rotating platen spins. In one embodiment, as the rotation speed increases for a given set of process variables (for example chemistry and temperature), the preferential formation on higher regions increases. Spinning the rotating platen at higher rotational speeds causes the modified layer to be more preferentially formed on the one or more features, such that a thickness of the modified layer is greater on the higher regions, than on the lower regions of the one or more features. In some embodiments, the rotating platen may be rotated at speeds of 30 RPM or more to preferentially form the modified layer on the higher regions. In other embodiments, the rotating platen may be rotated at speeds of 100 RPM or more. For example, RPMs of 200 RPM or more may be utilized. In some embodiments, a rotational speed up to for example 6,000 RPM may be utilized while practicing the techniques described herein.

When the modified layer is subsequently removed (in one example, but not limited to, a subsequent plasma removal step), the higher regions are preferentially etched to lessen the height differential between the higher and lower regions of the one or more features. In one embodiment, the removal step may be a plasma step. By repeating the steps of forming the modified layer and removing the modified layer, the selective ALE process described herein may be used to gradually reduce a height of the one or more features until a desired planarization of the one or more features is achieved. In one embodiment, height differential between the higher and lower regions of the one or more features is decreased by 25% to achieve a desired planarization. In another embodiment, the height differential is decreased by 50% or more. Thus, a planarization technique is provided in which a spatial atomic processing system is utilized to provide an ALE process which planarizes (or improves the planarity of) a patterned substrate. As the height of the higher features is reduced, the area of the ALE chemistry is increased, which will reduce the etch as the features are planarized. In this manner, the selective ALE process described herein achieves planarization of a patterned substrate without the physical damaging effects of conventional CMP techniques, and thus, may be a desirable alternative to CMP or used in conjunction with CMP to reduce the damaging effects of CMP. In one embodiment, a step on the substrate may be planarized by at least twenty-five percent, in another embodiment by fifty percent, and in still another embodiment by seventy-five percent or more.

FIG. 1 illustrates one example of a spatial atomic layer processing system that may be used to planarize a patterned substrate. More specifically, FIG. 1 depicts one embodiment of a spatial atomic layer processing system that may be used to gradually reduce a height of one or more features formed on a patterned substrate using the selective ALE process described herein. It is recognized, however, that the system shown in FIG. 1 is merely one example system in which the techniques described herein may be utilized. Other spatial atomic layer processing systems may also be used to perform the techniques described herein.

FIG. 1 provides a top-down view of a spatial atomic layer processing system 100 as seen inside a process chamber 105 of the spatial atomic layer processing system 100. As shown in FIG. 1, a rotating platen 110 is provided within the process chamber 105 for holding one or more substrates 115. Each of the substrates 115 may be arranged on a susceptor (not shown), which supplies heat to the substrate. A number of processing sections and purge sources may also be provided within the process chamber 105 and located above the rotating platen 110 for providing various gases to the substrate. Gas outlet pumping ports 140 may also be provided.

In the example embodiment shown in FIG. 1, spatial atomic layer processing system 100 includes three process sections: a precursor adsorption section 120, an optional processing section 124 and a plasma treatment section 128. The precursor adsorption section 120, optional processing section 124 and plasma treatment section 128 are separated by inert gas areas, where the inert gas is introduced by purge sources 130. The inert gases injected by purge sources 130 and the separate exhaust configuration provided by gas outlet pumping ports 140 enable fast rotation speeds of the system without detrimental effects of precursors and reactants mixing.

While some embodiments of the selective ALE process may utilize all three process sections, other embodiments may not. In some embodiments, for example, the selective ALE process may use the precursor adsorption section 120 to form a modified layer on a patterned substrate and may use the plasma treatment section 128 to remove the modified layer. In other embodiments, the selective ALE process may use the optional processing section 124 to supply one or more gases (e.g., an oxygen containing gas, an inert gas or a precursor gas) to the patterned substrate after forming the modified layer within the precursor adsorption section 120 and prior to removing the modified layer within the plasma treatment section 128. Though the embodiment of FIG. 1 uses a plasma treatment section 128 for the etch step of the ALE process, it will be recognized that non-plasma techniques may also be utilized for the etch step as the particular atomic layer processing system 100 shown in FIG. 1 is merely exemplary.

Precursor adsorption section 120 may be generally configured to provide a first precursor gas to the one or more substrates 115. When a substrate is rotated under the precursor adsorption section 120, a surface of the substrate is exposed to the first precursor gas, which adsorbs on and reacts with the surface material to produce a modified layer.

The precursor adsorption section 120 may provide the first precursor gas to the substrate in a variety of different ways. In the illustrated embodiment, the precursor adsorption section 120 includes a showerhead 121 and a precursor gas injector 122 for injecting the first precursor gas into a process space arranged above the substrates 115. The showerhead 121 and the precursor gas injector 122 may be configured in any known manner.

The precursor adsorption section 120 may be configured to provide a wide variety of precursor gases to the substrates 115. In some embodiments, for example, the first precursor gas may be a metal containing precursor gas, such as for example, but not limited to, trimethylaluminum (TMA), titanium tetrachloride ($TiCl_4$), Bis-t-butylaminosilane (BTBAS), Tetrakis(dimethylamino)Titanium (TDMAT), Tris (Dimethylamino)silane (3DMAS), Tetrakisenhtylmethyl-aminoHafnium (TEMAHf), etc. It is recognized, however, that the first precursor gas is not strictly limited to metal containing precursor gases and may include other precursor gases commonly used in semiconductor processing. For example, the precursor adsorption section 120 may alternatively provide any of a wide range of gases including but not limited to $BCl_3$, $O_2$, Ar, HF, $Cl_2$, $CF_4$, He, $NF_3$, $H_2$, $C_4F_8$, $CH_3F$, $CHF_3$, $SF_6$, $O_3$, $C_3H_3F_3$, HCl, $NH_4OH$, $TiCl_4$, $SiCl_4$, $CF_4/O_2$, and/or $F_2$/He, etc.

Plasma treatment section 128 is provided for generating a plasma, which can be used to remove (or etch) the modified layer. Plasma may be generated by supplying one or more process gases to the plasma treatment section 128 while power is applied to one or more electrodes disposed above and/or below a substrate rotated under the plasma treatment section 128. In one example embodiment, a source voltage can be applied to an upper electrode arranged above a substrate, and a bias voltage can be applied to a lower electrode arranged below the substrate to generate a high-frequency electric field between the upper and lower electrodes. The high-frequency electric field dissociates and converts the one or more process gases supplied to the plasma treatment section 128 into a plasma, which can be used in various types of treatments such as, but not limited to, plasma etching, deposition and/or sputtering.

In the embodiments disclosed herein, the plasma generated within the plasma treatment section 128 is used to remove (or etch) the modified layer, typically one monolayer at a time. When a substrate is rotated under the plasma treatment section 128, a surface of the substrate exposed to the plasma is bombarded with ions to remove the modified layer. As known in the art, the bias voltage may be selected or adjusted to control the ion bombardment energy, and thus, control the depth to which the modified layer is removed.

Various plasma etch chemistries may be used within the plasma treatment section 128 to remove the modified layer. For example, Ar plasmas, He plasmas, thermal desorption, or plasma chemistries including a wide range of gases including but not limited to $BCl_3$, $O_2$, Ar, HF, $Cl_2$, $CF_4$, He, $NF_3$, $H_2$, $C_4F_8$, $CH_3F$, $CHF_3$, $SF_6$, $O_3$, $C_3H_3F_3$, HCl, $NH_4OH$, $TiCl_4$, $SiCl_4$, etc., may be used all as is well-known in the art.

In some embodiments, the optional processing section 124 may be used to provide one or more gases (e.g., an oxygen containing gas, an inert gas or a second precursor gas) to the substrates 115 before the modified layer is removed within the plasma treatment section 128. The optional processing section 124 may provide the one or more gases to the substrate in a variety of different ways. In the illustrated embodiment, the optional processing section 124 includes a showerhead 125 and a gas injector 126 for injecting the gas(es) into a process space arranged above the substrates 115. The showerhead 125 and the gas injector 126 may be configured in any known manner.

The optional processing section 124 may be configured to provide a wide variety of gases to the substrates 115. In some embodiments, the optional processing section 124 may provide an oxygen containing gas, such as for example, oxygen ($O_2$), ozone ($O_3$), etc., to the substrates. When a substrate is rotated under the optional processing section 124 and an oxygen containing gas is provided, a surface of the substrate may be exposed to the oxygen containing gas to oxidize the modified layer. In some embodiments, the oxidation may be used, or may assist, in removing the modified layer. It is recognized, however, that the optional processing section 124 is not strictly limited to providing oxygen containing gases and may be used in other embodiments to provide other gases to the substrate surface. For example, the optional processing section 124 may be alternatively used to expose a surface of the substrate to an inert gas (e.g., argon, nitrogen, or another inert gas) or a second precursor gas.

As the rotating platen 110 rotates (as indicated by the arrows), the one or more of substrates 115 are moved in sequence under the precursor adsorption section 120, the optional processing section 124 and the plasma treatment section 128 to perform one or more cycles of the selective atomic layer etch (ALE) process described herein. Purge sources 130 provide a gas purge (e.g., an argon, nitrogen, or other inert gas purge) after the substrates 115 rotate past the precursor adsorption section 120 and the plasma treatment section 128 to prevent gas mixing. Although not shown in FIG. 1, a controller may be provided for controlling various operating parameters of the spatial atomic layer processing system 100 including, for example, temperatures, gas flows, pressures, rotation speeds, number of cycles, etc.

The selective ALE process described herein may be utilized for planarizing a patterned substrate in a spatial atomic layer processing system, such as but not limited to the spatial atomic layer processing system 100 shown in FIG. 1 and described above. In the selective ALE process described herein, the rotation of the rotating platen 110 and the substrates 115 may be repeated for a number of cycles needed to achieve a desired amount of planarization. In some embodiments, a complete ALE cycle including layer modification and removal steps may be performed each rotation of the rotating platen 110. If the removal step requires more time than provided by the high rotational speed of the rotating platen 110, the layer modification and removal steps may be separated, such that one rotation of the rotating platen 110 provides layer modification, while separate, additional rotation(s) are used to remove the modified layer.

In some embodiments of the selective ALE process described herein, a patterned substrate comprising one or more features may be provided on a rotating platen of a spatial atomic layer processing system, and a modified layer may be preferentially formed on higher regions of the one or more features by exposing a surface of the patterned substrate to a first precursor gas while the rotating platen spins at a high rotational speed. The fast rotation speed reduces the exposure time to the features, which effectively creates a depletion condition such that the precursor gas does not have time to diffuse below the highest surfaces of the patterned substrate. The first precursor gas adsorbs on and reacts with a surface material of the patterned substrate to produce the modified layer. When the modified layer is subsequently removed (e.g., in a subsequent plasma removal step), the higher regions are preferentially etched to lessen the height differential between the higher and lower regions of the one or more features. By repeating the steps of forming the modified layer and removing the modified layer, the selective ALE process described herein may be used to gradually reduce a height of the one or more features until a desired planarization of the one or more features is achieved.

Figure 2:
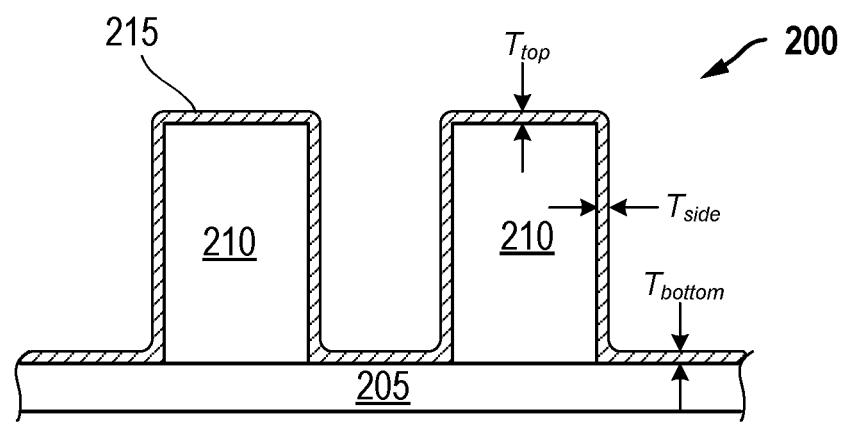
FIG. 2 is cross-sectional view of a patterned substrate comprising a modified layer formed upon one or more features, where a thickness of the modified layer is substantially equal on the top, bottom and sides of the one or more features.
Figure 3:
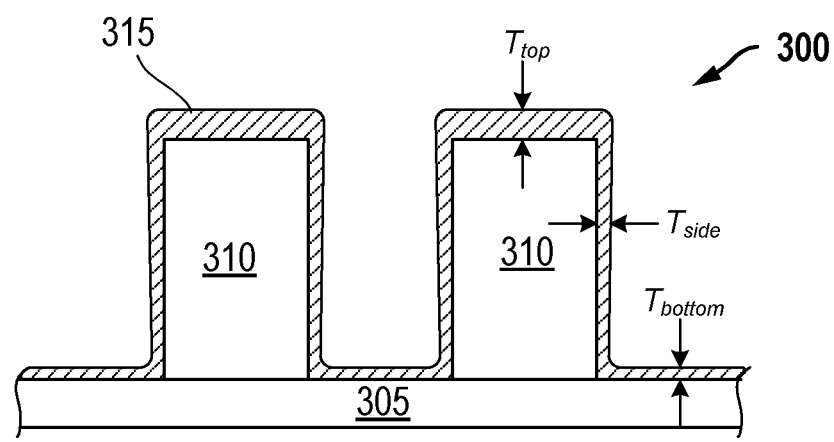
FIG. 3 is cross-sectional view of another patterned substrate comprising a modified layer formed upon one or more features, where a thickness of the modified layer is greater on the top than on the bottom and sides of the one or more features.
Figure 4:
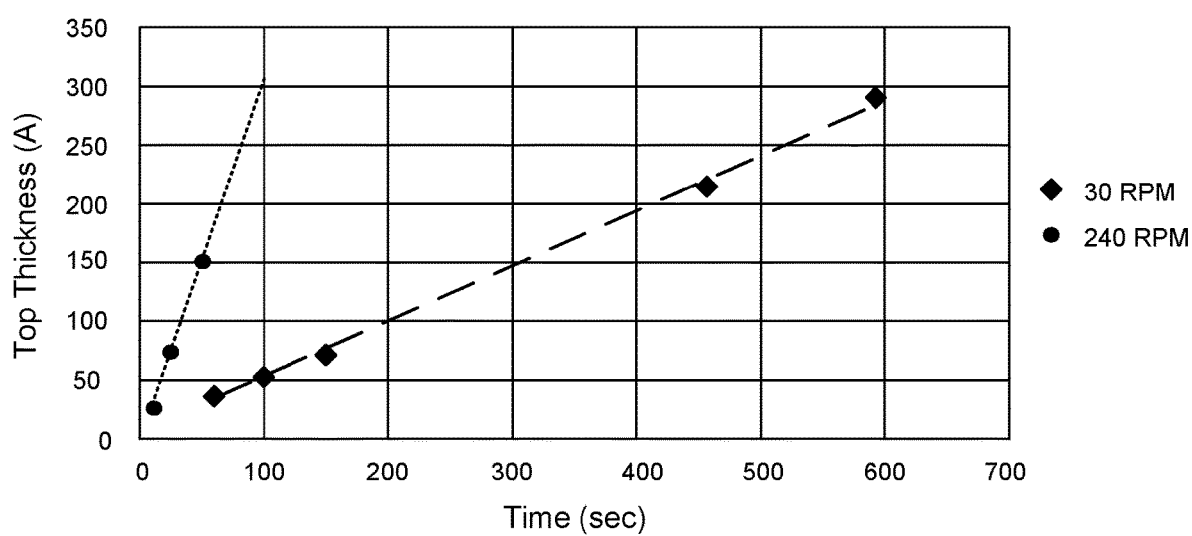
FIG. 4 is a graph comparing a thickness (in angstroms) of a modified layer that may be formed on the top of one or more features over time (seconds) when a rotating platen of a spatial atomic layer processing system is spun at 30 rotations per minute (RPM) and 240 RPM.

Spinning the rotating platen at high rotational speed aids in the modified layer being preferentially formed on the higher regions of the one or more features as compared to the lower regions of the one or more features. More specifically, spinning the rotating platen at a rotational speed greater than, for example, 30 RPM for some ALE chemistries causes the modified layer to be preferentially formed on the one or more features, such that a thickness of the modified layer is greater on the higher regions, than on the lower regions of the one or more features. The relationship between layer thickness and rotational speed is illustrated in FIGS. 2-4. It will be recognized, however, that rotational speeds may be dependent upon the particular chemistries utilized in the ALE process.

FIG. 2 provides a cross-sectional view of a patterned substrate 200 comprising one or more features 210 formed on a substrate 205. The patterned substrate 200 may be provided on a rotating platen of a spatial atomic layer processing system, as discussed above in reference to FIG. 1. In the embodiment shown in FIG. 2, a modified layer 215 is formed on the patterned substrate 200 by exposing a surface of the patterned substrate 200 to a first precursor gas while the rotating platen spins at a relatively low rotational speed. The first precursor gas adsorbs onto and reacts with the surface of the patterned substrate 200 to form the modified layer 215. When formed at low rotational speeds, the thickness of the modified layer 215 is substantially equal on the top ($T_{top}$), bottom ($T_{bottom}$) and sides ($T_{side}$) of the one or more features 210. When the modified layer 215 is subsequently removed (e.g., in a subsequent plasma removal step), the higher regions and lower regions of the one or more features 210 (or the substrate 205) may be etched somewhat equally. Therefore, rotating the platen at low rotational speed fails to provide the desired planarization.

FIG. 3 provides a cross-sectional view of a patterned substrate 300 comprising one or more features 310 formed on a substrate 305. The patterned substrate 200 may be provided on a rotating platen of a spatial atomic layer processing system, as discussed above in reference to FIG. 1. In the embodiment shown in FIG. 3, a modified layer 315 is formed on the patterned substrate 300 by exposing a surface of the patterned substrate 300 to a first precursor gas while the rotating platen spins at a relatively high rotational speed (e.g., for some ALE chemistries, a rotational speed greater than 30 RPM). The first precursor gas adsorbs onto and reacts with the surface of the patterned substrate 300 to form the modified layer 315. When formed at high rotational speeds, the thickness of the modified layer 315 is greater on the top ($T_{top}$) than on the bottom ($T_{bottom}$) and sides ($T_{side}$) of the one or more features 310. This is desirable, as it would enable the tops of the features 210 to be preferentially etched when the modified layer 215 is subsequently removed.

To achieve preferential formation of the modified layer 315 on the top of the features, the rotating platen may generally be rotated at a high rotational speed. In some embodiments, the rotating speed of the rotating platen may be selected from a range between 30 RPM and 240 RPM. In other embodiments, the rotating speed of the rotating platen may be selected from a broader range between 100 RPM and 6,000 RPM. In one example embodiment, a rotational speed greater than 200 RPM may be used to preferentially form the modified layer 315 on the higher regions (e.g., the top and/or upper sides) of the features. However, the rotational speed needed to achieve preferential formation of the modified layer 315 on the higher regions may generally depend on the precursor gas chemistry used to form the modified layer.

FIG. 4 is a graph comparing a thickness (in angstroms) of an exemplary modified layer (e.g., aluminum oxide ($Al_2O_3$)) that may be formed on the top of the features over time (seconds) when a rotating platen of a spatial atomic layer processing system is spun at 30 RPM and 240 RPM. As shown in FIG. 4, the thickness of the modified layer formed on the top of the features increases much faster when the rotating platen is spun at 240 RPM vs 30 RPM. It will be recognized that $Al_2O_3$ is exemplary and other modified layers may be formed.

FIGS. 5A-5E illustrate one embodiment of a process flow for planarizing a patterned substrate 400 using the selective ALE process described herein. As shown in FIG. 5A, the patterned substrate 400 may include one or more features 410 formed on a substrate 405. The features 410 shown in FIGS. 5A-5E may represent any features or structures on a substrate (e.g., a semiconductor wafer) for which planarization may be desirable. In some embodiments, the height of the one or more features 410 may be substantially equal, or may vary across the patterned substrate 400. As shown in FIGS. 5B-5E, the patterned substrate 400 may be planarized by performing one or more cycles of the selective ALE process described herein to gradually reduce the height of the one or more features 410.

In some embodiments, the selective ALE process described herein may begin by providing the patterned substrate 400 shown in FIG. 5A on a rotating platen of a spatial atomic layer processing system. In FIG. 5B, a modified layer 415 is formed on the patterned substrate 400 by exposing a surface of the patterned substrate 400 to a precursor gas while the rotating platen spins at a relatively high rotational speed. The precursor gas adsorbs onto and reacts with the surface of the patterned substrate 400 to form the modified layer 415. The rotational speed of the platen and the precursor gas chemistry may be selected, so that the modified layer 415 is formed primarily on the top 412 and/or on the upper sides 414 of the one or more features 410.

In FIG. 5C, the modified layer 415 is removed to reduce the height of the one or more features 410. In some embodiments, a surface of the patterned substrate 400 may be exposed to a plasma to remove the modified layer 415 via plasma atomic layer etching.

In FIG. 5D, another modified layer 425 is formed on the patterned substrate 400 by exposing a surface of the patterned substrate 400 to a precursor gas while the rotating platen spins at a relatively high rotational speed. The precursor gas adsorbs onto and reacts with the surface of the patterned substrate 400 to form the modified layer 425. As noted above, the rotational speed of the platen and the precursor gas chemistry may be selected, so that the modified layer 425 is formed primarily on the top 412 and/or on the upper sides 414 of the one or more features 410.

In some embodiments, the rotational speed of the platen may be the same when forming modified layer 415 and modified layer 425. In other embodiments, the rotational speed of the platen may be adjusted when forming one or more of the modified layers. For example, the rotational speed of the platen may be increased when forming modified layer 425 compared to the rotational speed used to form modified layer 415. By varying the rotational speed of the platen as additional modified layers are formed, the selective ALE process described herein may be used to vary the preferential formation of the modified layer on the top and/or on upper sides of the features.

In FIG. 5E, the modified layer 425 is again removed to further reduce the height of the one or more features 410. In some embodiments, a surface of the patterned substrate 400 may be exposed to a plasma to remove the modified layer 425 via plasma atomic layer etching.

The layer modification (FIGS. 5B and 5D) and removal (FIGS. 5C and 5E) steps may be repeated for a number of cycles until a desired planarization is achieved. In some embodiments, a layer modification step and a removal step may be performed for each rotation of the rotating platen. In other embodiments, the layer modification and removal steps may be separated, such that layer modification is performed during one rotation of the platen, while separate, additional rotation(s) are used to remove the modified layer. A configuration is also possible in which multiple modification layers and removal steps are processed for each rotation if multiple segments are designed in the chamber.

Figure 6A:
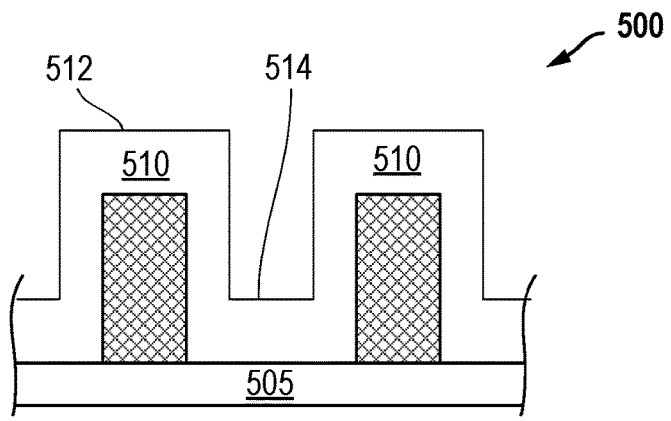
FIGS. 6A-6E illustrate another embodiment of a process flow for planarizing a patterned substrate using the techniques described herein.

FIGS. 6A-6E illustrate another embodiment of a process flow for planarizing a patterned substrate 500 using the selective ALE process described herein. As shown in FIG. 6A, the patterned substrate 500 may include one or more features 510 formed on a substrate 505. The features 510 shown in FIGS. 6A-6E may represent any features or structures on a substrate (e.g., a semiconductor wafer) for which planarization may be desirable. In some embodiments, the one or more features 510 may have higher regions 512 and lower regions 514, and the patterned substrate 500 may be planarized by performing one or more cycles the selective ALE process described herein to gradually reduce a height differential between the higher regions 512 and the lower regions 514.

Figure 6B:
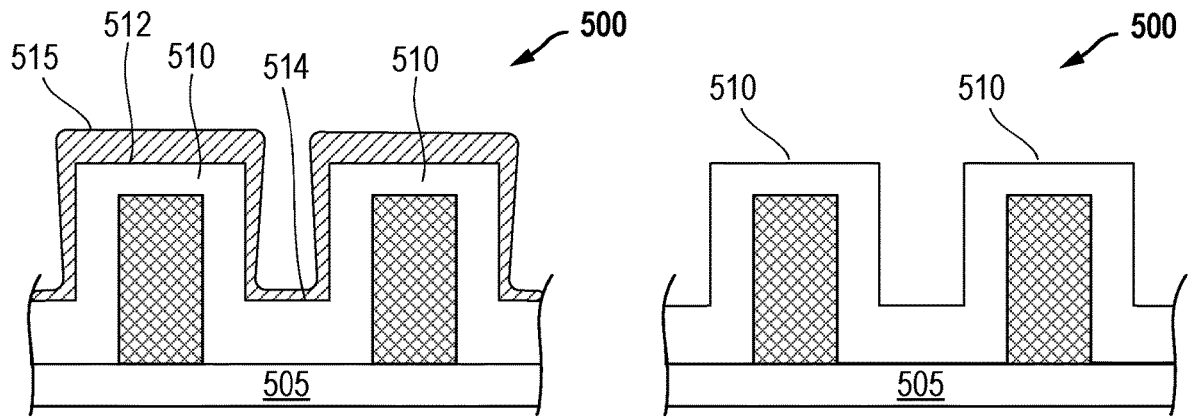

In some embodiments, the selective ALE process described herein may begin by providing the patterned substrate 500 on a rotating platen of a spatial atomic layer processing system. In FIG. 6B, a modified layer 515 is formed on the patterned substrate 500 by exposing a surface of the patterned substrate 500 to a precursor gas while the rotating platen spins at a relatively high rotational speed. The precursor gas adsorbs onto and reacts with the surface of the patterned substrate 500 to form the modified layer 515. The rotational speed of the platen and the precursor gas chemistry may be selected, so that the modified layer 515 is preferentially formed on the higher regions 512 of the one or more features 510 as compared to the lower regions 514 of the one or more features 510. As shown in FIG. 6B, for example, the modified layer 515 may be preferentially formed, such that a thickness of the modified layer 515 is greater on the higher regions 512 than on the lower regions 514 of the one or more features 510.

Figure 6C:
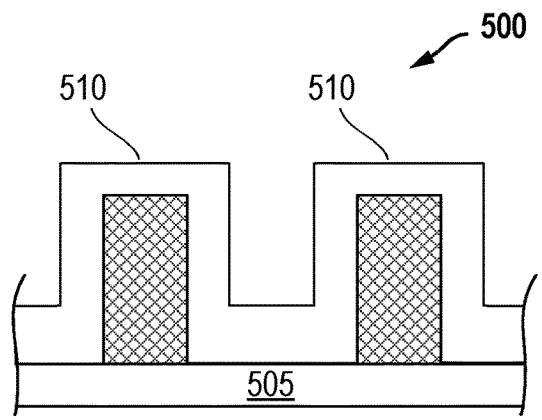

In FIG. 6C, the modified layer 515 is removed to reduce or lessen the height differential between the higher regions 512 and the lower regions 514 of the one or more features 510. In some embodiments, a surface of the patterned substrate 500 may be exposed to a plasma to remove the modified layer 515 via plasma atomic layer etching.

Figure 6D:
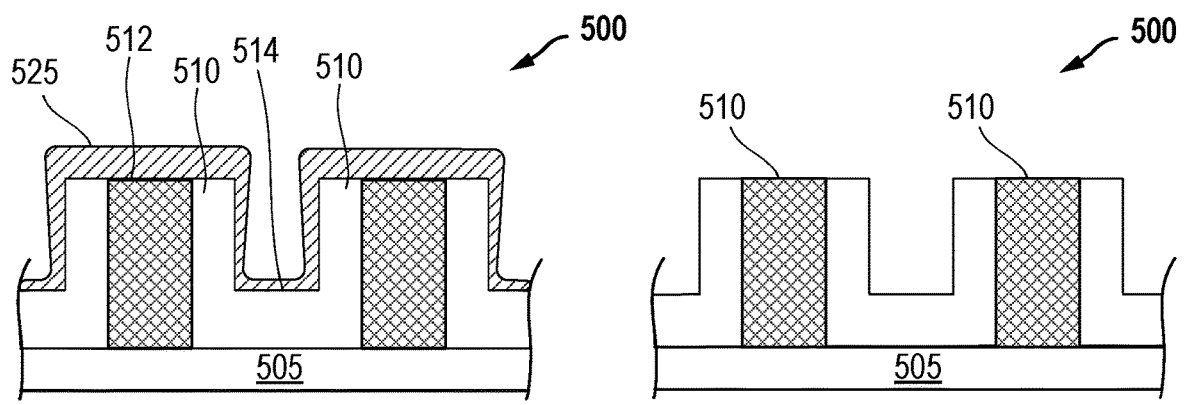

In FIG. 6D, another modified layer 525 is formed on the patterned substrate 500 by exposing a surface of the patterned substrate 500 to a precursor gas while the rotating platen spins at a relatively high rotational speed. The precursor gas adsorbs onto and reacts with the surface of the patterned substrate 500 to form the modified layer 525. As noted above, the rotational speed of the platen and the precursor gas chemistry may be selected, so that the modified layer 525 is preferentially formed on the higher regions 512 of the one or more features 510 as compared to the lower regions 514 of the one or more features 510. As shown in FIG. 6D, for example, the modified layer 525 may be preferentially formed, such that a thickness of the modified layer 525 is greater on the higher regions 512 than on the lower regions 514 of the one or more features 510.

In some embodiments, the rotational speed of the platen may be the same when forming modified layer 515 and modified layer 525. In other embodiments, the rotational speed of the platen may be adjusted when forming one or more of the modified layers. For example, the rotational speed of the platen may be increased when forming modified layer 525 compared to the rotational speed used to form modified layer 515. By gradually increasing the rotational speed of the platen as additional modified layers are formed, the selective ALE process described herein may be used to vary the preferential formation of the modified layer on the top and/or on upper sides of the features.

Figure 6E:
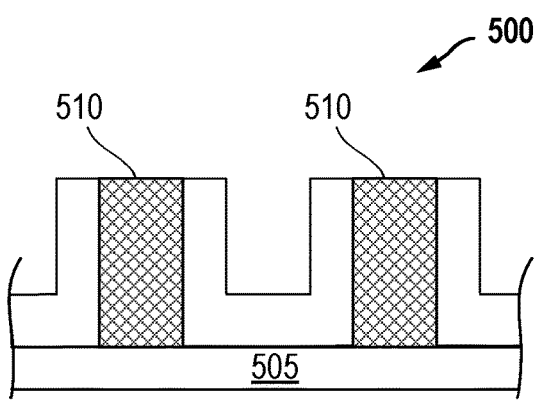

In FIG. 6E, the modified layer 525 is again removed to further reduce or lessen the height differential between the higher regions 512 and the lower regions 514 of the one or more features 510. In some embodiments, a surface of the patterned substrate 500 may be exposed to a plasma to remove the modified layer 525 via plasma atomic layer etching.

The layer modification (FIGS. 6B and 6D) and removal (FIGS. 6C and 6E) steps may be repeated for a number of cycles until a desired planarization is achieved. In some embodiments, a layer modification step and a removal step may be performed for each rotation of the rotating platen. In other embodiments, the layer modification and removal steps may be separated, such that layer modification is performed during one rotation of the platen, while separate, additional rotation(s) are used to remove the modified layer.

Thus, as shown in and described with reference to FIGS. 5A-5E and 6A-6E, a selective ALE process may be utilized to planarize a patterned substrate. The amount of planarization may vary in accordance with the ALE chemistries utilized and the number of cycles of the process. In one embodiment, the selective ALE process described herein may be used to gradually reduce a height of one or more features until a desired planarization of the one or more features is achieved. Thus, a planarization technique is provided in which a spatial atomic processing system is utilized to provide an ALE process which planarizes the substrate. In one embodiment, height differentials are decreased by 25%. In another embodiment, height differentials are decreased by 50% or more. In still other embodiments, height differentials may be nearly completely removed.

The techniques described herein may be utilized to improve the planarity in whole or in part a wide range of types of features. Thus, it will be recognized that the physical arrangement and geometries of the features 410 and features 510 discussed above are merely exemplary and other features may advantageously take advantage of use of the techniques described herein. Further, the features may be formed of any of a wide range of materials that are utilized in the substrate processing art. In one example, the features may be formed of oxide. In one particular example, the features may be formed of silicon oxide. Still in other examples, the features may be formed of silicon, silicon nitride, aluminum oxide, titanium oxide, and/or hafnium oxide. Other materials may also be utilized however. Further, the features may be formed by a combination of materials and or structures so the features need not be homogenous, but rather could be for example, formed by multiple layers of differing materials.

It will be recognized that, although the rotational speed of the rotating platen is disclosed above as a key variable, which can be used and/or controlled to improve the planarity of a patterned substrate, other variables or combinations of variables can also be used to improve planarity. As non-limiting examples, the techniques described herein may improve planarity of a patterned substrate by controlling one or more of the following variables or process conditions: the rotational speed (e.g., RPM) of the rotating platen, the chemistry of various gases used to implement the selective ALE process (e.g., precursor gases, etching gases or ratios of gases), the duration of the layer modification step and/or duration of the removal step, the number of cycles used to achieve the desired planarity, and other features of the spatial atomic layer processing system (such as, e.g., temperature, pressure, vacuum, etc.). In addition to those noted above, other variables and/or process conditions may be selected and/or controlled to improve the planarity of a patterned substrate. For example, various plasma parameters, such as the concentration of one or more gases supplied to the substrate surface, the gap or distance between the plasma source and the substrate surface, the source power and/or the bias power may be selected to achieve a desired planarization. Other processing parameters, such as ozone density, inert gas dilution, gas ratios and/or gas injector designs may also be chosen to achieve a desired planarization.

In some embodiments, the spatial atomic layer processing system 100 shown in FIG. 1 may be utilized to provide a desired planarization, or otherwise improve the planarity of, a patterned substrate. Although the spatial atomic layer processing system 100 shown in FIG. 1 is provided as an example processing system in which the techniques described herein may be utilized, the disclosed techniques are not limited to the system illustrated in FIG. 1. In some embodiments, one or more components or features may be added or removed from the spatial atomic layer processing system 100 shown in FIG. 1. In other embodiments, a more sophisticated processing system using automated recipe databases, input from other automated system, etc., may be used to implement the techniques described herein.

Figure 7:
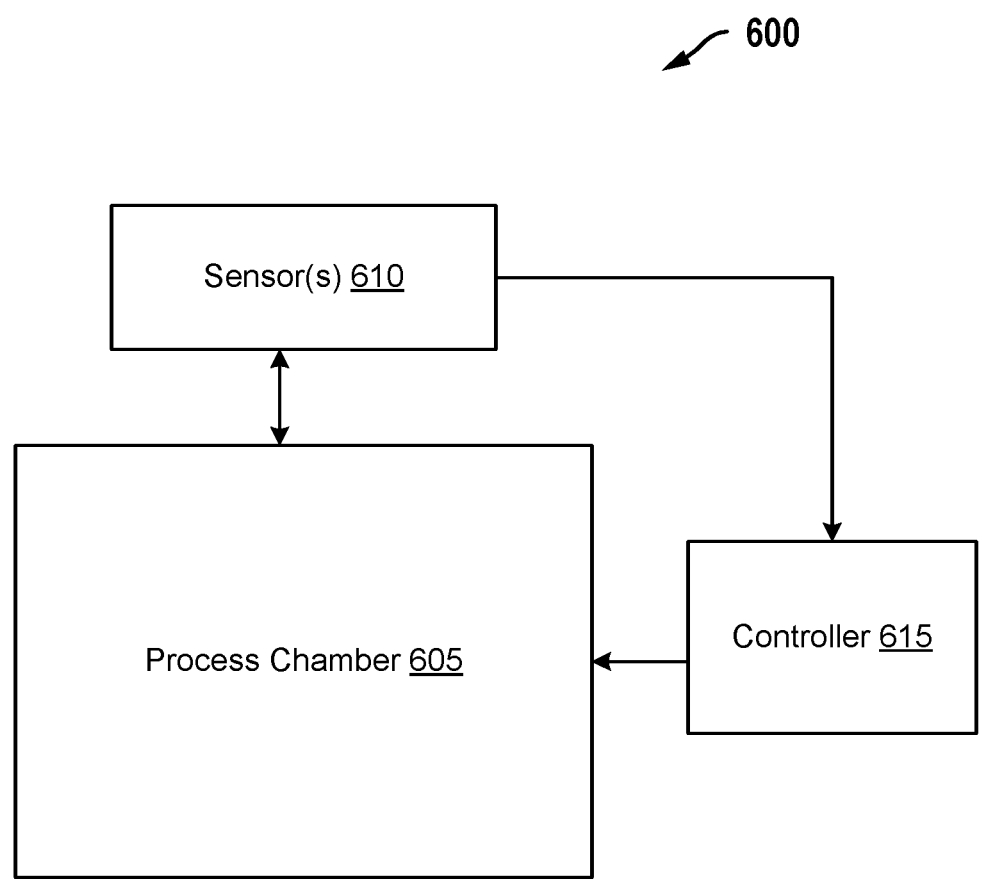
FIG. 7 is a block diagram illustrating another embodiment of a spatial atomic layer processing system that may be used to perform the techniques described herein.

FIG. 7 illustrates another embodiment of a spatial atomic layer processing system 600 that may be used to planarize a patterned substrate. As shown in FIG. 7, the spatial atomic layer processing system 600 may generally include a process chamber 605, one or more sensors 610 and a controller 615. In some embodiments, the process chamber 605 may be similar to the process chamber 105 shown in FIG. 1, and may include a rotating platen and a number of processing sections (e.g., a precursor adsorption section 120, an optional processing section 124 and a plasma treatment section 128), purge sources and gas outlet pumping ports. However, the process chamber 605 is not restricted to the process chamber 105 shown and described in FIG. 1 and may be configured differently in other embodiments.

In the spatial atomic layer processing system 600 shown in FIG. 6, sensor(s) 610 and controller 615 are provided for monitoring various parameters and automatically adjusting one or more variables and/or process conditions of the system or process described herein to achieve a planarity objective. In some embodiments, the planarity objective may be a desired planarization or a desired reduction in the height differential between the higher regions and the lower regions of the features on the patterned substrate. In some embodiments, the planarity objective may include a target throughput number of substrates per hour.

Sensor(s) 610 may be coupled to and/or located within process chamber 605 for monitoring various parameters of the substrate, the system 600 and/or the selective ALE process described herein. Sensor(s) 610 may include various types of sensors including, but not limited to, optical sensors (such as cameras, lasers, light, reflectometer, spectrometers, etc.), capacitive sensors, ultrasonic sensors, gas sensors, or other sensors that may monitor a condition of the substrate and/or the system 600. In one example embodiment, one or more optical sensors may be used to measure the height differential of the higher regions and the lower regions in-situ of the process chamber 105. In another example embodiment, a spectrometer may be used to measure a film thickness of one or more layers provided on the patterned substrate. In yet another embodiment, a residual gas analyzer (RGA) may be used to detect precursor breakdown for real-time chemical reaction completion detection.

Controller 615 is coupled for receiving data from sensor(s) 610 and configured for controlling one or more process parameters of the process chamber 605 based on the sensor data. In some embodiments, controller 615 may be configured to analyze the data collected by the sensor(s) 610 and provide feedback to control various process parameters of components of process chamber 605. In some embodiments, controller 615 may use or analyze the sensor data to determine when to end one or more steps of the selective ALE process described herein. For example, controller 615 may receive data from a residual gas analyzer to detect an endpoint of the layer modification step. In another example, controller 615 may utilize spectroscopic ellipsometry to detect an average film thickness on the substrate during rotation and provide an indication of film thickness change during the selective ALE process. In some embodiments, controller 615 may automatically end the selective ALE process when a planarity objective is achieved, such as when a desired planarization or a desired reduction in the height differential between the higher and lower regions of the features is achieved. In some embodiments, controller 615 may automatically adjust one or more parameters during the process to achieve the planarity objective. The sensor data and the controller may also be utilized to achieve a desired substrate throughput objective. Further, the sensor data and the controller may be utilized to achieve a desired planarity objective along with a desired substrate throughput objective or alternative balance the various objectives.

It is noted that the controller(s) 615 described herein can be implemented in a wide variety of manners. In one example, the controller may be a computer. In another example, controller 615 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for controller 94. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 8:
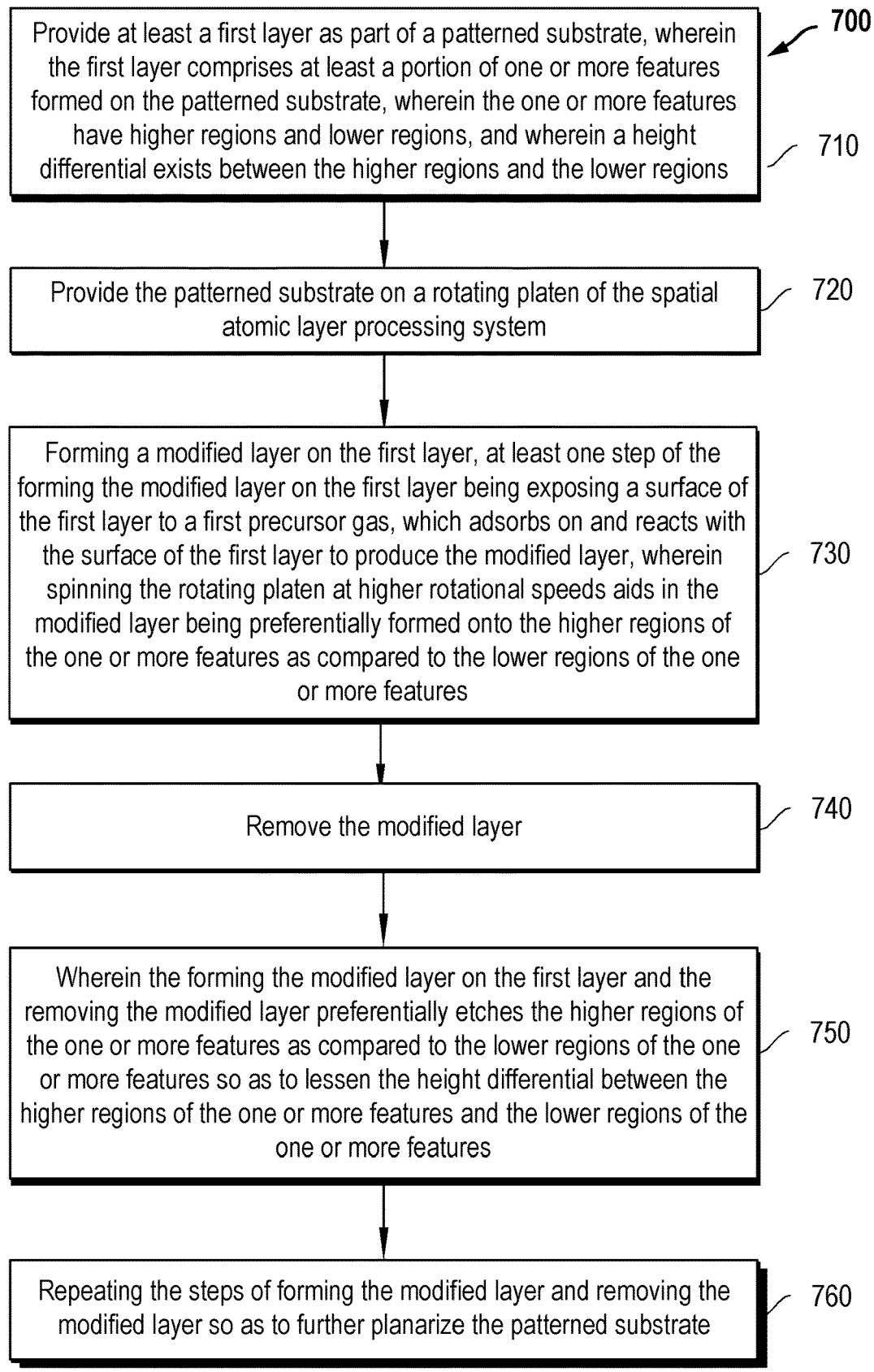
FIG. 8 is a flowchart diagram illustrating one embodiment of a method for planarizing a patterned substrate using the techniques described herein.
Figure 9:
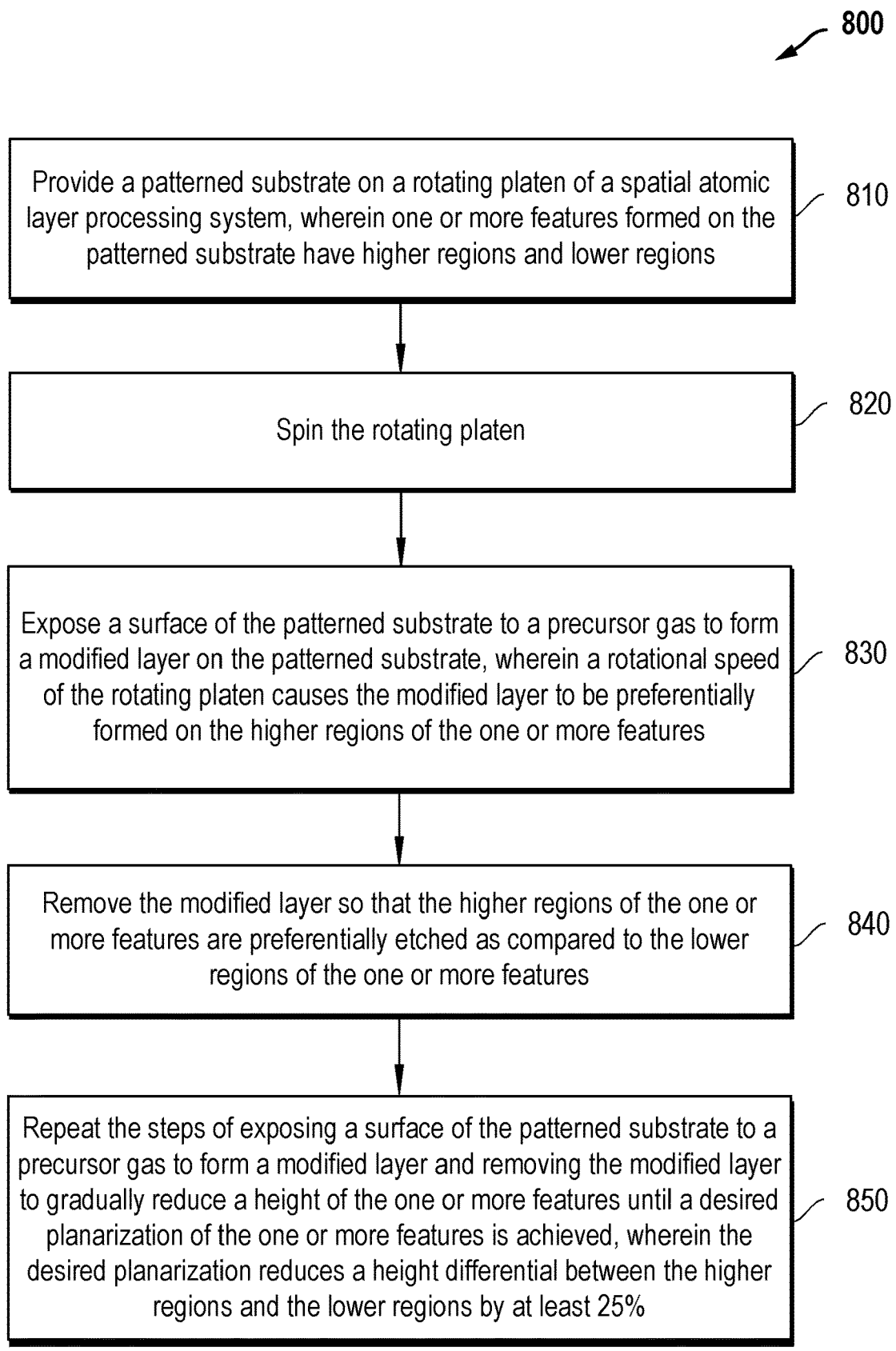
FIG. 9 is a flowchart diagram illustrating another embodiment of a method for planarizing a patterned substrate using the techniques described herein.

FIGS. 8-9 illustrate embodiments of methods that utilize the techniques described herein. It will be recognized that the embodiments shown in FIGS. 8-9 are merely exemplary and additional methods may utilize the techniques described herein. Further, additional processing steps may be added to the methods shown in FIGS. 8-9 as the steps described are not intended to be exclusive. Moreover, the order of the steps is not limited to the order shown in the figures as different orders may occur and/or various steps may be performed in combination or at the same time.

FIG. 8 illustrates one embodiment of a method 700 for planarizing a patterned substrate in a spatial atomic layer processing system. In step 710, the method 700 provides at least a first layer as part of the patterned substrate. In some embodiments, the first layer may comprise at least a portion of one or more features formed on the patterned substrate. In some embodiments, the one or more features may have higher regions and lower regions, such that a height differential exists between the higher regions and the lower regions. Next, the method 700 may provide the patterned substrate on a rotating platen of the spatial atomic layer processing system (in step 720).

In step 730, the method 700 forms a modified layer on the first layer. At least one step of forming the modified layer on the first layer may include exposing a surface of the first layer to a first precursor gas, which adsorbs on and reacts with the surface of the first layer to produce the modified layer. Spinning the rotating platen at a higher rotational speeds aids in the modified layer being preferentially formed onto the higher regions of the one or more features, as compared to the lower regions of the one or more features.

In step 740, the method 700 removes the modified layer. By forming the modified layer on the first layer (in step 730) and subsequently removing the modified layer (in step 740), the method 700 preferentially etches the higher regions of the one or more features, as compared to the lower regions of the one or more features, so as to lessen the height differential between the higher regions of the one or more features and the lower regions of the one or more features (in step 750). In some embodiments, the method 700 may repeat the steps of forming the modified layer and removing the modified layer so as to further planarize the patterned structure in step 760.

FIG. 9 illustrates one embodiment of a method 800 for planarizing a patterned substrate in a spatial atomic layer processing system. In step 810, the method 800 provides the patterned substrate on a rotating platen of the spatial atomic layer processing system. As noted above, one or more features formed on the patterned substrate may have higher regions and lower regions. In step 820, the method 800 spins the rotating platen. In step 830, the method 8700 exposes a surface of the patterned substrate to a precursor gas to form a modified layer on the patterned substrate. In method 800, the rotational speed of the rotating platen causes the modified layer to be preferentially formed on the higher regions of the one or more features.

In step 840, the method 800 removes the modified layer so that the higher regions of the one or more features are preferentially etched as compared to the lower regions of the one or more features. In step 850, the method 800 repeats the steps of exposing a surface of the patterned substrate to a precursor gas to form a modified layer and removing the modified layer to gradually reduce a height of the one or more features until a desired planarization of the one or more features is achieved. In some embodiments, the desired planarization may reduce the height differential between the higher regions and the lower regions by at least 25%.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for planarizing a patterned substrate in a spatial atomic layer processing system, the method comprising:
    providing at least a first layer on a patterned substrate, the patterned substrate having an upper surface, a lower surface and a sidewall between the upper and lower surface, wherein a portion of the first layer has a first thickness on the upper surface and a second thickness for a portion of the first layer on at least one of the sidewall or lower surface;
    providing the patterned substrate on a rotating platen of the spatial atomic layer processing system, the rotating platen having a rotational speed of at least 30 RPM;
    forming a modified layer on the first layer, at least one step of the forming the modified layer on the first layer being exposing a surface of the first layer to a first precursor gas, which adsorbs on and reacts with the surface of the first layer to produce the modified layer, wherein spinning the rotating platen at higher rotational speeds aids in the modified layer being preferentially formed onto the portion of the first layer on the upper surface as compared to the portion of the first layer on the sidewalls or lower surface;
    removing the modified layer, wherein the forming the modified layer on the first layer and the removing the modified layer preferentially etches the portion of the first layer on the upper surface relative to the portion of the first layer on the sidewalls or lower surface so as to lessen the height differential between the remaining first layer on the upper surface compared to the remaining first layer on the sidewall or lower surface; and
    repeating the steps of forming the modified layer and removing the modified layer, wherein the rotational speed of the rotating platen is adjusted during one or more of the steps of forming the modified layer and removing the modified layer.

2. The method of claim 1, wherein a rotational speed of the rotating platen causes enhanced deposition of a first precursor of the first precursor gas on the higher regions portion of the first layer on the upper surface of the one or more features as compared to the lower regions of the one or more features the first layer on the sidewall or lower surface.

3. The method of claim 1, wherein a rotational speed of the rotating platen is selected from a range between 30 RPM and 240 RPM.

4. The method of claim 1, wherein the height differential between the higher regions and the lower regions is reduced by at least 50%.

5. The method of claim 1, wherein a thickness of the modified layer is greater on the portion of the first layer on the upper surface than on the first layer on the sidewall or lower surface.

6. The method of claim 1, wherein the first precursor gas comprises trimethylaluminum, $BCl_3$, HF, $Cl_2$, $CF_4/O_2$, and/or $F_2$/He.

7. The method of claim 6, wherein the first layer comprises an oxide.

8. The method of claim 7, wherein removing the modified layer comprises a plasma removal step.

9. The method of claim 1, wherein removing the modified layer comprises a plasma removal step.

10. The method of claim 1, wherein the first layer comprises an oxide.

11. A method for planarizing a patterned substrate in a spatial atomic layer processing system, the method comprising:
    providing the patterned substrate on a rotating platen of the spatial atomic layer processing system, the patterned substrate having an upper surface, a lower surface and a sidewall surface between the upper and lower surface;
    spinning the rotating platen;
    exposing a surface of the patterned substrate to a precursor gas to form a modified layer on the patterned substrate, wherein a rotational speed of the rotating platen causes the modified layer to be preferentially formed on the upper surface;
    removing the modified layer so that the upper surface is preferentially etched as compared to the lower surface or the sidewall surface; and
    repeating the steps of exposing a surface of the patterned substrate to a precursor gas to form a modified layer and removing the modified layer to reduce a height of the one or more features until a desired planarization of patterned substrate is achieved, wherein the desired planarization reduces a height differential between the upper surface and the lower surface by at least 25%, wherein the rotational speed of the rotating platen is adjusted during one or more of the steps of exposing a surface of the patterned substrate to a precursor gas to form a modified layer and removing the modified layer.

12. The method of claim 11, wherein the rotational speed of the rotating platen is selected from a range between 30 RPM and 240 RPM.

13. The method of claim 11, wherein the desired planarization reduces the height differential between the upper surface and the lower surface by at least 50%.

14. The method of claim 11, wherein the precursor gas comprises trimethylaluminum, $BCl_3$, HF, $Cl_2$, $CF_4/O_2$, and/or $F_2$/He.

15. The method of claim 14, wherein the surface of the patterned substrate comprises an oxide.

16. The method of claim 11, wherein the surface of the patterned substrate comprises an oxide.

17. The method of claim 16, wherein the rotational speed of the rotating platen is above 200 RPM.

18. The method of claim 11, wherein the removing the modified layer comprises a plasma removal step.

* * * * *